(12) United States Patent
Cheng et al.

(10) Patent No.: US 6,297,144 B1
(45) Date of Patent: Oct. 2, 2001

(54) DAMASCENE LOCAL INTERCONNECT PROCESS

(75) Inventors: Hsin-Li Cheng, Taipei; Chang-Da Yang, Changhua Hsien; Ping-Wei Wang, Hsinchu, all of (TW)

(73) Assignee: Worldwide Semiconductor Manufacturing Corporation, Taipei Hsien (TW)

( * ) Notice: Subject to any disclaimer, the term of this patent is extended or adjusted under 35 U.S.C. 154(b) by 0 days.

(21) Appl. No.: 09/521,085

(22) Filed: Mar. 7, 2000

(30) Foreign Application Priority Data

Nov. 17, 1999 (TW) .................................................. 88120019

(51) Int. Cl.$^7$ ................................................ H01L 21/4763
(52) U.S. Cl. ...................... 438/618; 438/638; 438/687; 438/648; 438/644
(58) Field of Search ..................... 438/627, 618, 438/622, 637, 638, 639, 640, 641, 675, 687, 688, 643, 648, 685, 644

(56) References Cited

U.S. PATENT DOCUMENTS 5,972,789 * 10/1999 Jeng et al. ............................ 438/637
6,107,189 * 8/2000 Wald et al. ........................... 438/637
6,191,027 * 2/2001 Omura .................................. 438/627
6,207,553 * 3/2001 Buynoski et al. .................... 438/638

* cited by examiner

Primary Examiner—Tuan H. Nguyen
(74) Attorney, Agent, or Firm—Fish & Richardson P.C.

(57) ABSTRACT

The present invention discloses a novel damascene local interconnect process to avoid junction leakage caused by poor interface of the interconnection with isolation edges. The process comprises the steps of: (a) forming a first dielectric layer over the substrate surface; (b) forming an interconnection in the upper level of the dielectric layer which spans over the first and second active areas; (c) forming a second dielectric layer over the first dielectric layer and the interconnection; (d) etching first and second contact holes adjacent to the opposite ends of the interconnection through the second and first dielectric layers, the first and second contact holes extending down to the first and second active area respectively; and (e) filling the first and second contact holes with first and second conductive plugs respectively, wherein the interconnection thereby connects the first and second conductive plugs to couple the first and second active areas.

8 Claims, 3 Drawing Sheets

DAMASCENE LOCAL INTERCONNECT PROCESS

BACKGROUND OF THE INVENTION

1. Field of the Invention

The present invention relates in general to the manufacture of semiconductor integrated circuits. More particularly, it relates to a novel damascene interconnect process to avoid junction leakage.

2. Description of the Related Arts

Damascene is an interconnect fabrication process in which trenches for metal lines are etched in an interlevel dielectric (ILD) layer and filed with metal. The excess metal on the surface is removed and a planar structure with metal inlays in the dielectric layer is achieved. This process has several advantages over the traditional metal/ILD/planarization approach: (1) the surface at any time is totally flat; (2) the process eliminates the difficulty in filling small gaps between metal wires; and (3) it eliminates the difficulty in metal etching.

Damascene has been demonstrated in a number of applications. The most commonly applied process is the local interconnect. However, as shown in FIG. 1, once the process is applied in local interconnect 100 between different active areas, the edges 201 of isolation regions 200 result in large junction leakage. In semiconductor memory devices, the interconnect junction leakage become a critical issue for data storage. Thus, the aim of the present invention is to eliminate the disadvantages of the conventional approach while keeping the benefits of the damascene local interconnect.

SUMMARY OF THE INVENTION

It is therefore an object of the invention to provide a novel damancene local interconnect process to avoid junction leakage caused by the isolation edges.

To attain the above object, the present invention provide a process for forming a damascene local interconnect over a semiconductor substrate having first and second active areas which are isolated from each other, comprising the steps of: (a) forming a first dielectric layer over the substrate surface; (b) forming an interconnection in the upper level of the dielectric layer which spans over the first and second active areas; (c) forming a second dielectric layer over the first dielectric layer and the interconnection; (d) etching first and second contact holes adjacent to the opposite ends of the interconnection through the second and first dielectric layers, the first and second contact holes extending down to the first and second active areas respectively; and (e) filling the first and second contact holes with first and second conductive plugs respectively, wherein the interconnection thereby connects the first and second conductive plugs to couple the first and second active areas.

In accordance with the present invention, the step (b) is a typical damascene process which may comprise the steps of: forming an interconnection pattern in the upper level of the dielectric layer which spans over the first and second active areas; and filling the interconnection pattern with a conductive material such as tungsten. Instead of directly connecting active areas in the same level, the interconnection according to the present process is formed in the upper level of ILD layer and connects the conductive plugs to couple different active areas of the integrated circuit. As a result, the interconnection is exempted from contact with the isolation areas, thereby avoiding the interconnect junction leakage.

Other objects, features, and advantages of the present invention will become apparent from the following detailed description which makes reference to the accompanying drawings.

DESCRIPTION OF THE PREFERRED EMBODIMENTS

Figure 1:
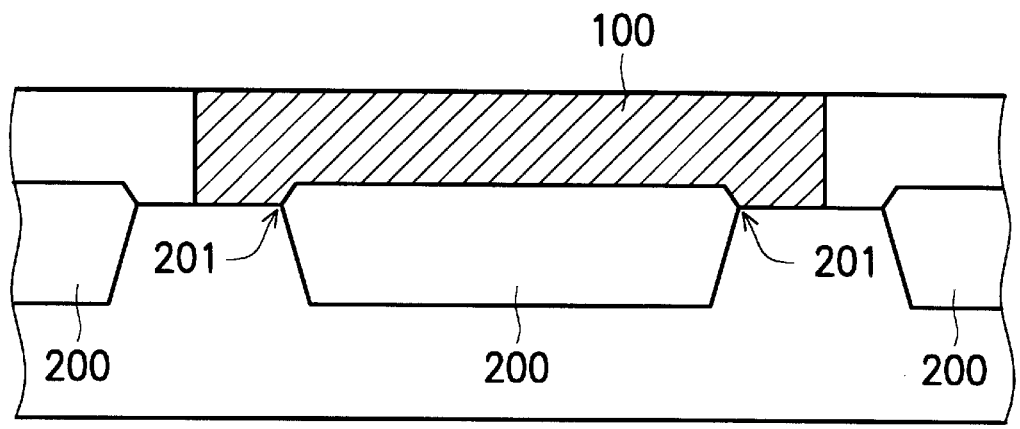
FIG. 1 is a cross-sectional view showing the structure of a conventional damascene local interconnect.
Figure 2:
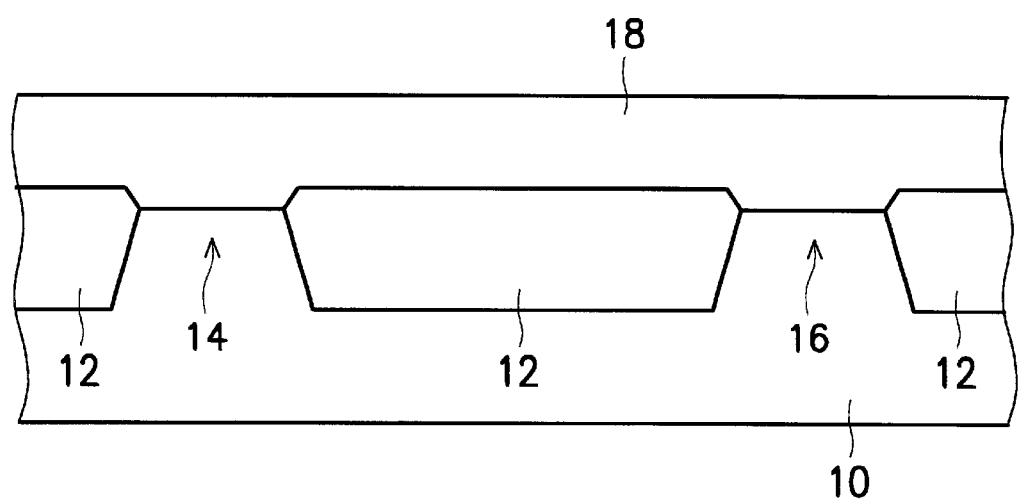
FIGS. 2 through 6 are cross-sectional views illustrating the steps for fabricating a damascene local interconnect according to a preferred embodiment of the invention.

The present invention will be described in detail with reference to the accompanying drawings. Referring now to FIG. 2, a cross sectional view of a portion of an integrated circuit is shown. The process begins by providing a semiconductor substrate 10 having a first active area 14 and a second active area 16 which are isolated from each other by trench isolation areas 12. The process details for forming such isolation areas are well known and will not be described here. The trench isolation areas 12 can also be field oxide areas formed by a LOCOS process. Only the isolation and active areas are shown for the sake of clarity though typically the substrate should also contain MOS transistors or other device components Referring to FIG. 2, a first dielectric layer 18 is deposited over the entire substrate surface and is preferably planarized. The purpose of the dielectric material is to electrically insulate the underlying portions of the substrate from the local interconnect and other elements that may be manufactured above the dielectric layer 18. The dielectric layer 18 may consist of one or more dielectric depositions of silicon oxide, bromophosphosilicate (BPSG), and the like. Preferably, the first dielectric layer 18 is planarized by reflow or CMP (Chemical-Mechanical Polishing) method.

Figure 3:
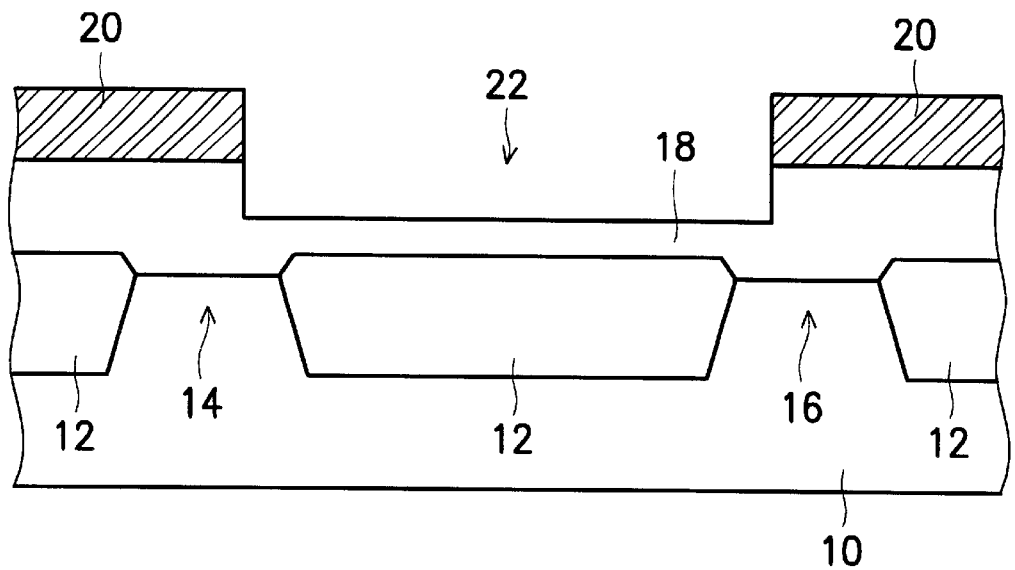

Next, an interconnection is formed in the upper level at the dielectric layer 18 by typical damascene technique. Referring to FIG. 3, a resist 20 having an interconnection pattern 22 which spans over the first active areas 14 and second active area 16 is formed over the first dielectric layer 18. Then the interconnection pattern 22 in the resist 20 is transferred into the upper level of the dielectric layer 18 by RIE (Reactive Ion Etching: method. Note that the etching stops before exposing the underlying isolation or active areas.

Figure 4:
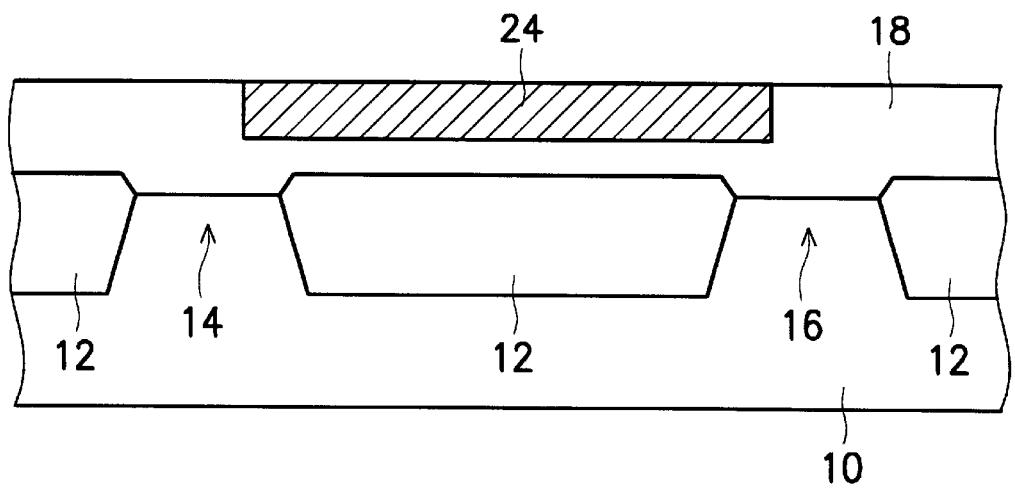

Referring to FIG. 4, the interconnection pattern 22 is filled with a conductive material to form an interconnection 24 which spans over the first active area 14 and second active area 16. An adhesion barrier metal film (not shown) such as a TiN or WN film is deposited on the entire surface to such a thickness as not to completely fill the interconnection pattern 22 by the sputtering method. Then a conductive material, for example, a tungsten film is formed on the entire surface to completely fill the interconnection pattern 22 by use of the CVD (Chemical Vapor Deposition) or PVD (Physical Vapor Deposition) method. Other suitable conductive materials include Al, Cu, Al-Si-Cu alloy, and Al-Cu alloy. Then, the adhesion film and tungsten film are polished by use of the CMP method until the dielectric layer 18 is exposed and thus the surface of the structure is made flat and an upper-level interconnection 24 is formed. Thus, the interconnection 24 is kept from contact with the active areas 14, 16 and the isolation areas 12.

Figure 5:
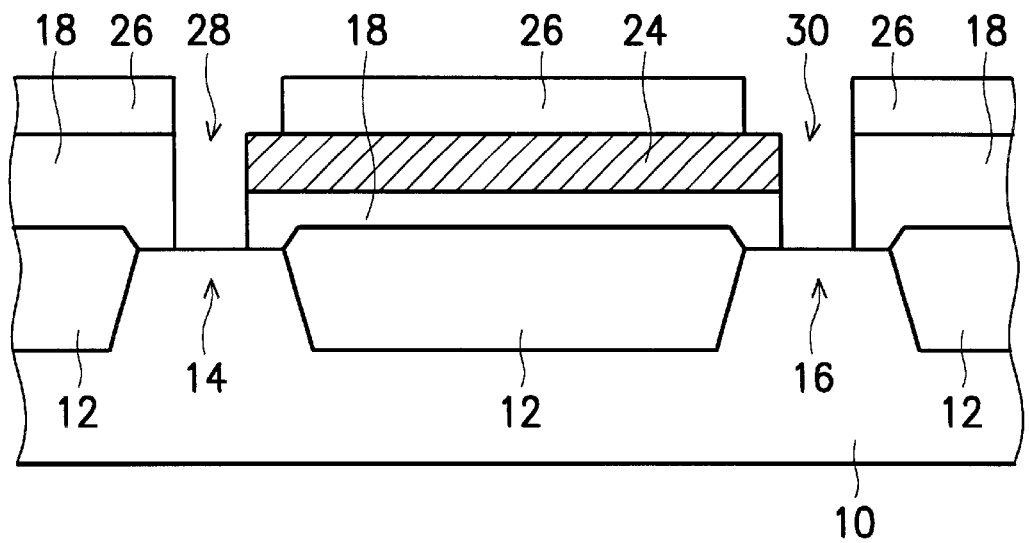

Referring to FIG. 5, a second dielectric layer 26 is deposited over the first dielectric layer 18 and the interconnection 24. Then, the first and second dielectric layers are selectively etched to form a first contact hole 28 and a second contact hole 30 adjacent to the opposite ends of the interconnection 24. As shown in FIG. 5, the contact holes 28, 30 extend down to the active areas 14, 16 respectively, which are to be electrically connecting by the interconnect. Because the etch recipe for the dielectric layer generally has an extremely high selectivity to metal, the interconnection 24 serves as a hard mask to ensure the isolation area 12 will not be exposed during the contact hole etch.

Figure 6:
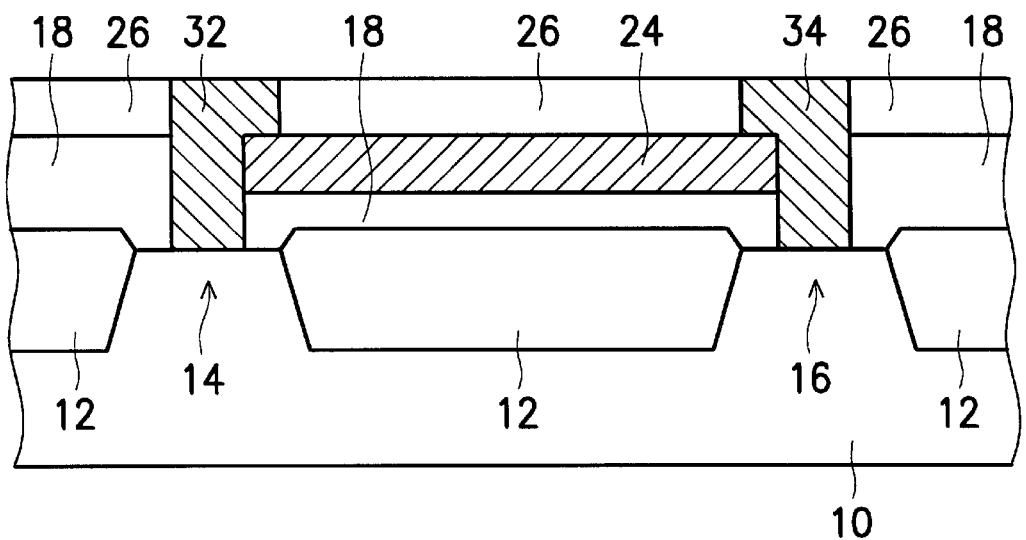

Referring to FIG. 6, an adhesion barrier metal film (not shown) is deposited over the bottoms and sidewalls of the contacts holes 32, 34 and then a conductive material such as tungsten is deposited to completely fill the contact holes to form conductive plugs 32, 34. Thereby, the interconnection 24 connects the first and second conductive plugs 32, 34 to couple the first and second active areas 14, 16 of the circuit. Since the interconnection 24 does not have any contact with the isolation area 12, the junction leakage caused by the poor interface of interconnection with isolation edges can be eliminated. Thus the reliability of the integrated circuit is improved.

While the invention has been particularly shown and described with the reference to the preferred embodiment thereof, it will be understood by those skilled in the art that various changes in form and details may be made without departing from the spirit and scope of the invention.

What is claimed is:

1. A process for forming a damascene local interconnect over a set conductor substrate having first and second active areas which are isolated from each other, said process comprising the steps of:

(a) forming a first dielectric layer over the substrate surface;

(b) forming an interconnection in the upper level of the dielectric layer which spans over said first and second active areas;

(c) forming a second dielectric layer over the first dielectric layer and the interconnection;

(d) etching first and second contact holes adjacent to the opposite ends of the interconnection through said second and first dielectric layers, said first and second contact holes extending down to said first and second active areas respectively; and (e) filling said first and second contact holes with first and second conductive plugs respectively, wherein the interconnection thereby connects the first and second conductive plugs to couple the first and second active areas.

2. The process as claimed in claim 1, wherein said step (b) comprises the steps of:

forming an interconnection pattern in the upper level of the dielectric layer which spans over said first and second active areas; and filling the interconnection pattern with a conductive material.

3. The process as claimed in claim 2, wherein said step (b) further comprises a step of depositing an adhesion layer over the interconnection pattern.

4. The process as claimed in claim 1, wherein said interconnection is formed of a material selected from the group consisting of W, Al, Cu, Al-Cu alloy and Al-Si-Cu alloy.

5. The process as claimed in claim 1, wherein said interconnection is tungsten interconnection.

6. The process as claimed in claim 1, wherein said step (e) further comprises a step of depositing an adhesion layer over the first and second contact holes.

7. The process is claimed in claim 1, wherein said first and second conductive plugs are formed and a material selected from the group consisting of W, Al, Cu, Al-Cu alloy and Al-Bi-Cu alloy.

8. The process as claimed in claim 1, wherein said first and second conductive plugs are tungsten plugs.

* * * * *